United States Patent
Won et al.

(10) Patent No.: US 7,109,132 B2
(45) Date of Patent: Sep. 19, 2006

(54) HIGH DENSITY PLASMA CHEMICAL VAPOR DEPOSITION PROCESS

(75) Inventors: Jai-Hyung Won, Seongnam (KR); Young-Kyou Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 60 days.

(21) Appl. No.: 10/723,517

(22) Filed: Nov. 26, 2003

(65) Prior Publication Data

US 2004/0166694 A1    Aug. 26, 2004

(30) Foreign Application Priority Data

Feb. 26, 2003   (KR) .................. 10-2003-0012028

(51) Int. Cl.
*H01L 21/31* (2006.01)

(52) U.S. Cl. .................. 438/788; 438/787; 438/763
(58) Field of Classification Search ............... 438/788, 438/787, 784, 778, 763, 761
See application file for complete search history.

(56) References Cited

U.S. PATENT DOCUMENTS 5,753,044 A * 5/1998 Hanawa et al. ........... 118/723 I
6,846,745 B1 * 1/2005 Papasouliotis et al. ...... 438/706

* cited by examiner

*Primary Examiner*—Michael Trinh
(74) *Attorney, Agent, or Firm*—F. Chau & Associates, LLC

(57) ABSTRACT

High-density plasma CVD processes with improved gap filling characteristics are provided. In one exemplary process, the process includes loading a semiconductor substrate into a process chamber. First main process gases, including a silicon source gas, an oxygen gas, a nitrogen free chemical etching gas and a hydrogen gas, are then injected into the process chamber. Thus, a high-density plasma is generated over the semiconductor substrate, and the semiconductor substrate is heated to a temperature in the range of about 550° C. to about 700° C. by the high-density plasma. Thus, a silicon oxide layer is formed to completely fill a gap region without any voids or defects in the semiconductor substrate. In addition, the first main process gases can be replaced with second main process gases including a silicon source gas, an oxygen gas, a nitrogen free chemical etching gas, a hydrogen gas and a helium gas.

12 Claims, 6 Drawing Sheets

HIGH DENSITY PLASMA CHEMICAL VAPOR DEPOSITION PROCESS

BACKGROUND

1. Technical Field

The present invention relates to a process of manufacturing a semiconductor device, and more particularly, to a high-density plasma chemical vapor deposition process for forming a material layer in gap regions in a semiconductor device.

2. Discussion of Related Art

As semiconductor devices become more highly integrated, gap regions have higher aspect ratios because of an area between adjacent interconnections has been reduced. In addition, as an aspect ratio increases for gap regions, the filling of the gap regions becomes more difficult. Generally, an interlayer-insulating layer is formed to fill gap regions using a low-pressure chemical vapor deposition (LPCVD) process. However, there are some limitations in using a LPCVD process in filling gap regions having a high aspect ratio. Therefore, a high-density plasma CVD process has been proposed because a high-density plasma CVD technique has improved gap-filling characteristics over the LPCVD and has been widely used in fabrication of the highly integrated semiconductor devices. Further, a high-density plasma CVD process fills a gap region having a high aspect ratio by deposition processes and sputter etching processes, which are alternately and repeatedly performed. However, conventional high-density plasma CVD processes also have certain limitations.

For instance, a conventional high-density plasma CVD process taught in U.S. patent Publication Ser. No. U.S. 2001/0019903 A1 to Shufflebotham et al., entitled "Inductively coupled plasma CVD". According to Shufflebotham et al., conductive lines, which are adjacent to each other, are formed on a semiconductor substrate, and the semiconductor substrate having the conductive lines is loaded on a chuck installed inside a process chamber. A reactant gas such as a hydrogen gas, an oxygen gas, a nitrogen gas, an ammonia ($NH_3$) gas or a nitrogen trifluoride ($NF_3$) gas as well as a silicon-containing gas such as a silane ($SiH_4$) gas, a silicon tetrafluoride ($SiF_4$) gas, a disilane ($Si_2H_6$) gas or the like are then injected into the process chamber to form a material layer that fills gap regions between the conductive lines. Before forming the material layer, the chuck maintains a temperature of 80° C. to 200° C. to produce a material layer having low stress.

However, in the disclosure of Shufflebotham et al., the material layer may contain fluorine atoms because the fluorine atoms dissociate from fluorine-based gases, such as a $SiF_4$ gas or a $NF_3$ gas, and cannot be completely exhausted through the outlet of the process chamber. In addition, if a hydrogen gas is used as a reactant gas, hydrogen atoms in the hydrogen gas react with the fluorine atoms to produce hydrofluoric acid (HF). Further, since the process maintains a temperature at 200° C. or below, the hydrofluoric acid is not vaporized and remains in the process chamber. Thus, even though the hydrogen gas is used as a reactant gas, the fluorine atoms still remain in the material layer. The fluorine atoms contained in the material layer generate lung-shaped defects. Further, the hydrogen atoms in the hydrogen gas can also exist in the material layer. The hydrogen atoms present in the material layer generate bubble defects in the material layer during subsequent thermal processes.

Furthermore, the process chamber is made of an aluminum oxide ($Al_2O_3$). The fluorine atoms dissociated from the fluorine-based gas react with the aluminum oxide and corrode the process chamber during formation of the material layer. Thus, the semiconductor substrate in the process chamber is contaminated with aluminum atoms. In addition, when a nitrogen gas or a nitrogen-base gas is used as a reactant gas, nitrogen atoms in the reactant gas react with the material layer. For instance, the nitrogen atoms react with a silicon oxide layer to form a silicon oxynitride layer or a silicon nitride layer in the material layer. Therefore, the material layer may locally exhibit non-uniform etch rates. Further, if contact holes are to be etched in the material layer, the contact holes may have an abnormal profile or may not be completely open because the material layer exhibits non-uniform etch rates.

Furthermore, Japanese Patent Publication Nos. 10092816 A and 10229081 A discloses a process of forming a silicon oxide layer having a low dielectric constant (e.g., a fluorine-doped silicon oxide layer) on a semiconductor substrate. The fluorine-doped silicon oxide layer is formed using a $SiF_4$ gas, and the semiconductor substrate is maintained at a temperature of below 400° C. so that the silicon oxide layer contains fluorine atoms dissociated from the $SiF_4$ gas.

Therefore, a need exists for using a high-density plasma chemical vapor deposition process to form a material layer without fluorine atoms in gap regions in semiconductor devices to prevent the formation of defects in the semiconductor devices.

SUMMARY OF THE INVENTION

It is an aspect of the present invention to provide a high-density plasma CVD process capable of minimizing the composition rate of fluorine for forming a material layer in a gap region in a semiconductor device.

It is another aspect of the present invention to provide a high-density plasma CVD process capable of minimizing the composition rate of hydrogen for forming a material layer in a gap region in a semiconductor device.

It is still another aspect of the present invention to provide high-density plasma CVD process capable of minimizing the composition rate of nitrogen for forming a material layer in a gap region in a semiconductor device.

It is still yet another aspect of the present invention to provide a high-density plasma CVD process being capable of minimizing the composition rates of fluorine, hydrogen and nitrogen, and improving gap-filling characteristics for forming a material layer in a gap region in a semiconductor device.

In one exemplary embodiment of the present invention, there is provided a high-density plasma CVD process for forming a silicon oxide layer, which is capable of filling gap regions without any voids or defects therein. The high-density plasma CVD process comprises loading a semiconductor substrate into a process chamber and injecting first main process gases into the process chamber. The first main process gases include a silicon source gas, an oxygen gas, a nitrogen free chemical etching gas and a hydrogen gas. Thus, a high-density plasma is generated over the semiconductor substrate, and the semiconductor substrate is heated to a temperature in a range of about 550° C. to about 700° C. due to the high-density plasma. The process gases then react with one another to form a silicon oxide layer on the semiconductor substrate.

The process above also provides that the high density plasma is generated by applying a plasma power and a bias power to an induction coil installed outside the process chamber and to the semiconductor substrate loaded into the process chamber, respectively, during injection of the first main process gases. Preferably, the plasma power is in the range of about 2500 to about 5000 watts and the bias power is in the range of about 800 to about 4000 watts.

According to another exemplary embodiment, the silicon source gas is a silane ($SiH_4$) gas or a disilane ($Si_2H_6$) gas. Also, the nitrogen free chemical etching gas is preferably a silicon fluoride ($SiF_4$) gas. The silicon source gas provides silicon atoms for the formation of a silicon oxide layer, and the nitrogen free chemical etching gas provides fluorine ions to chemically etch the silicon oxide layer. Most of the fluorine ions used in the chemical etching react with the hydrogen ions dissociated from a hydrogen gas to produce hydrofluoric acid. Because the semiconductor substrate is at a temperature in the range of about 550° C. to about 700° C., the hydrofluoric acid is completely vaporized, and the vaporized hydrofluoric acid gas is exhausted through an outlet in the process chamber.

In yet another exemplary embodiment, second main process gases are injected into the process chamber instead of the first main process gases. The second main process gases include a silicon source gas, an oxygen gas, and a nitrogen free chemical etching gas, a hydrogen gas and a helium gas. The helium gas provides helium atoms that contribute to a sputtering etching process. Therefore, if second main process gases are used, a physical etching process is simultaneously performed with the chemical etching process.

According to the exemplary embodiments of the present invention, the amount of the fluorine atoms, the nitrogen atoms and the hydrogen atoms contained in the silicon oxide layer can be minimized. Thus, the reliability of the silicon oxide layer is improved as well as the gap filling characteristics thereof.

These and other exemplary embodiments, features, aspects, and advantages of the present invention will be described and become apparent from the following detailed description of the exemplary embodiments when read in conjunction with the accompanying drawings.

DETAILED DESCRIPTION OF EXEMPLARY EMBODIMENTS

Figure 1:
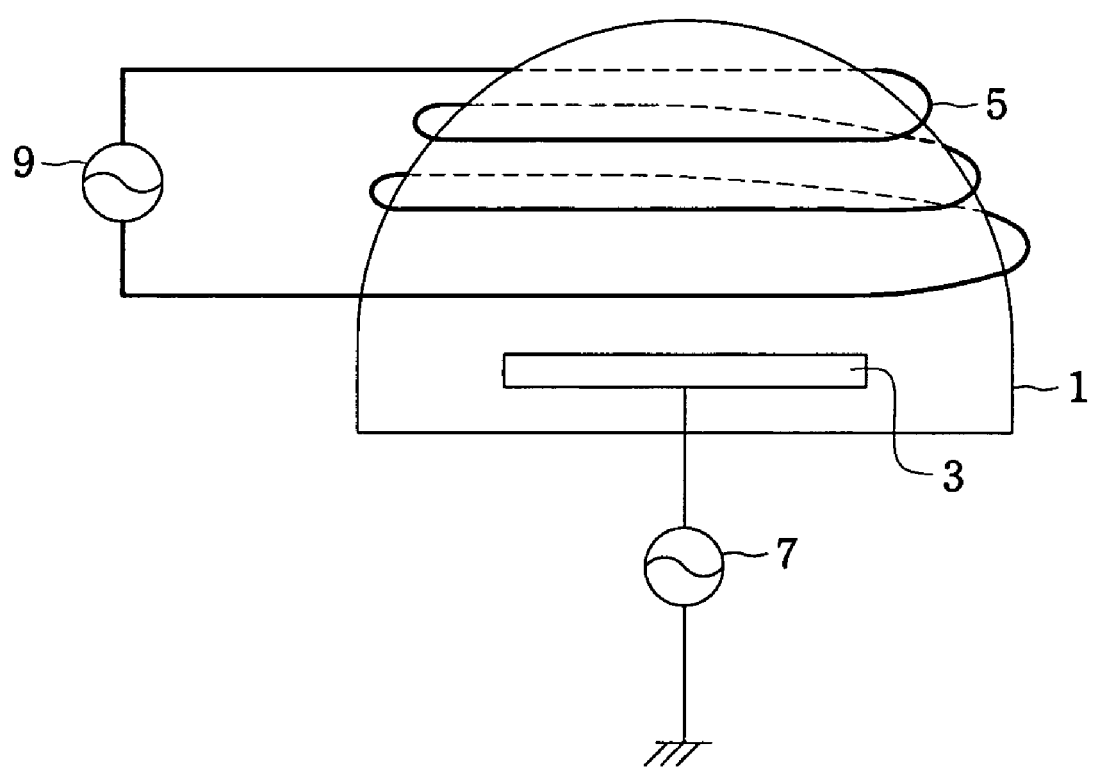
FIG. 1 is a schematic illustrating a high-density plasma CVD apparatus used in accordance with exemplary embodiments of the present invention.

The present invention will now be described more fully hereinafter with reference to the accompanying drawings, in which exemplary embodiments of the invention are shown.

This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of the layers and regions are exaggerated for clarity.

FIG. 1 is a schematic illustrating a high-density plasma CVD apparatus used in accordance with exemplary embodiments of the present invention. Referring to FIG. 1, a chuck 3 is installed inside a dome-shaped process chamber 1. The process chamber 1 is surrounded by an induction coil 5. The chuck 3 and the induction coil 5 are connected to a bias power source 7 and a plasma power source 9, respectively.

Figure 2:
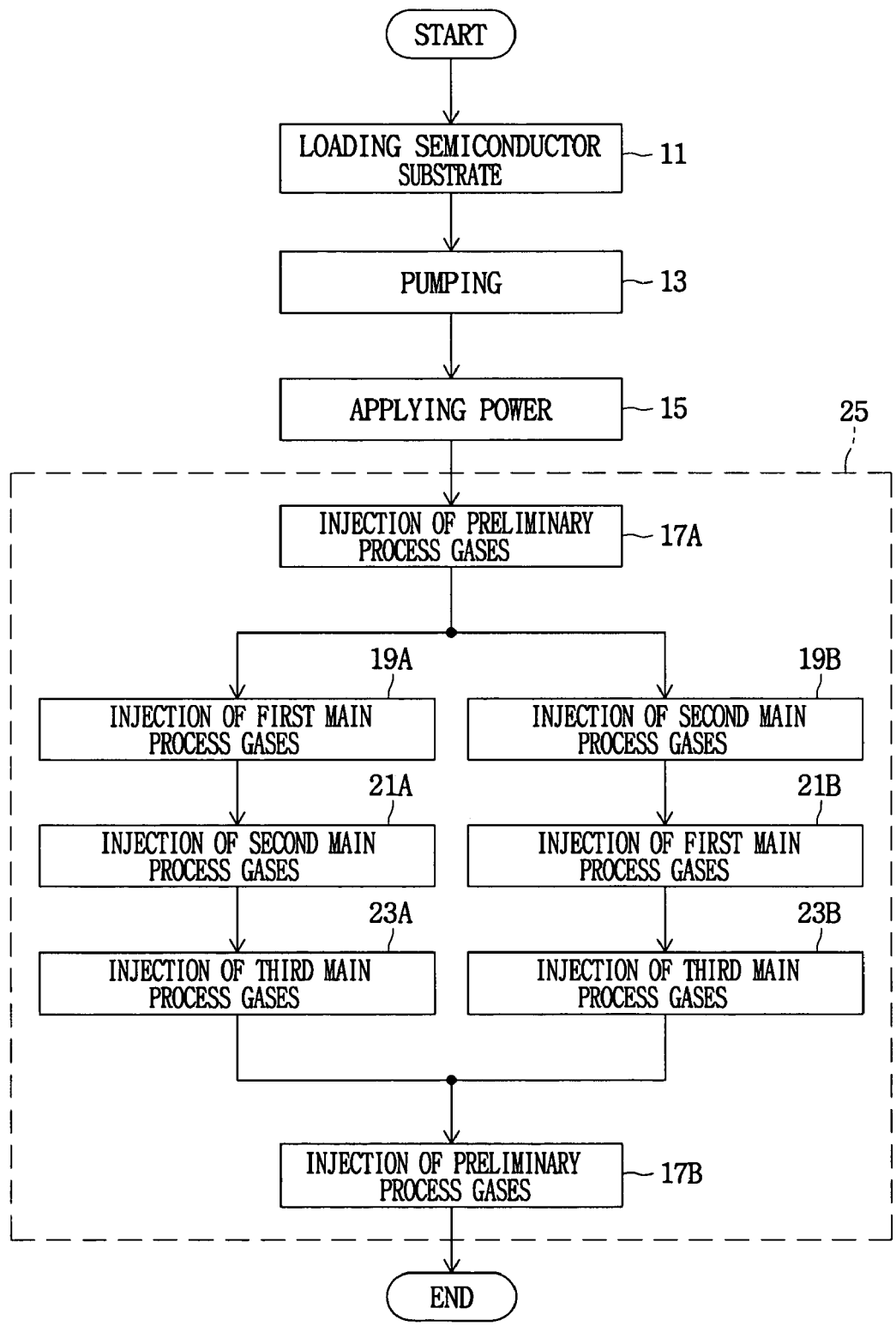
FIG. 2 is a process flow chart illustrating various exemplary embodiments of the present invention.
Figure 3:
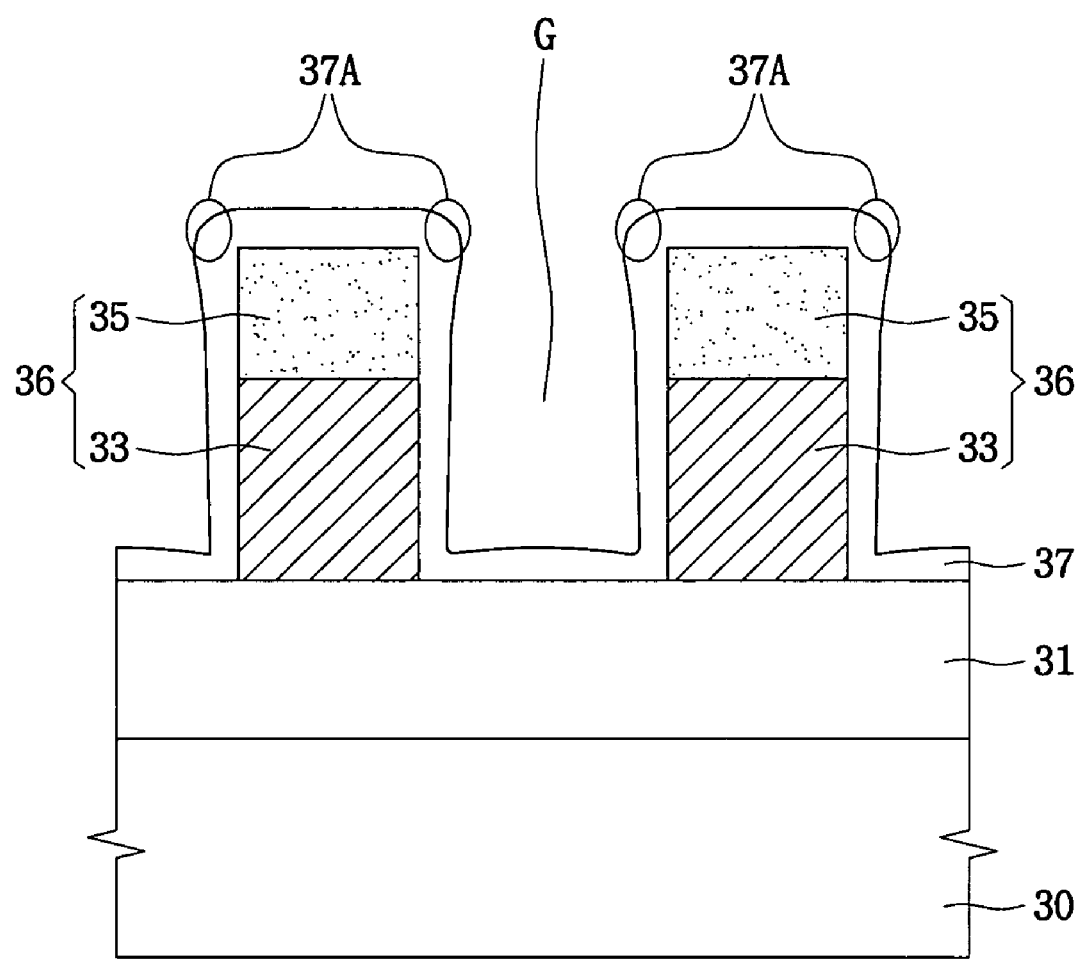
FIG. 3 is a cross-sectional view of a semiconductor device in accordance with embodiments of the present invention.

FIGS. 2 and 3 are a process flow chart and a cross-sectional view of a semiconductor device, respectively, in accordance with exemplary embodiments of the present invention. Referring to FIG. 3, an interlayer-insulating layer 31 is formed on a semiconductor substrate 30. At least two neighboring interconnection patterns 36 are formed on the interlayer-insulating layer 31. Each of the interconnection patterns 36 may include an interconnection 33 and a capping layer pattern 35, which are sequentially stacked. Thus, the semiconductor substrate having the interconnection patterns 36 has a surface step difference. In other words, a gap region G having a predetermined aspect ratio is formed between the interconnection patterns 36. The interconnection patterns 36 may correspond to gate patterns formed directly on the semiconductor substrate. Thus, the process of forming the interlayer-insulating layer 31 is omitted, and a predetermined region of the semiconductor substrate 30 can be exposed through the gap region G between the interconnection patterns 36.

Referring to FIGS. 1 through 3, a semiconductor substrate 30 having a gap region G is loaded onto the chuck 3 as shown in FIG. 1 (step 11 of FIG. 2). Then, the air in the process chamber 1 is exhausted using a vacuum pump (not shown), thereby creating a vacuum ambient within the process chamber 1 (step 13 of FIG. 2). The plasma power source 9 and the bias power source 7 are turned on to supply a plasma power and a bias power to the induction coil 5 and the chuck 3, respectively (step 15 of FIG. 2). The plasma power is preferably in the range of about 2500 to about 5000 watts, and the bias power is preferably in the range of about 800 to about 4000 watts. Also, process gases are injected into the process chamber 1 to produce high-density plasma over the chuck 3 (step 25 of FIG. 2). Preferably, the pressure in the process chamber 1 is in the range of about 2 to about 4 mTorr. Further, the semiconductor substrate on the chuck 3 is heated to a temperature of about 550° C. to about 700° C. Then, a material layer is formed on the semiconductor substrate.

The injection of the process gases (25 of FIG. 2) can be performed using various methods.

According to one exemplary embodiment of the present invention, the injection of the process gases (25 of FIG. 2) can be achieved by injecting only first main process gases (step 19A of FIG. 2), which include a silicon source gas, an oxygen gas, a nitrogen free chemical etching gas and a hydrogen gas. The silicon source gas may be a silane ($SiH_4$) gas or a disilane ($Si_2H_6$) gas, and the nitrogen free chemical etching gas is preferably a silicon fluoride ($SiF_4$) gas. The first main process gases react with one another inside the process chamber 1. Thus, a deposition process and an etching process are alternately and repeatedly performed on the semiconductor substrate, thereby forming a silicon oxide layer.

Further, the silicon source gas reacts with the oxygen gas to form an initial thin silicon oxide layer (37 of FIG. 3) on the semiconductor substrate. The initial silicon oxide layer 37 may include overhangs 37A on the upper corners of the interconnection patterns 36, as shown in FIG. 3. The overhangs 37A are chemically etched by fluorine ions dissociated from the chemical etching gas. Thus, while the first main process gases are supplied, a deposition process and an etching process are alternately and repeatedly performed to form the silicon oxide layer that completely fills the gap region G.

While the deposition and etching processes are performed, hydrogen ions dissociated from the hydrogen gas are bonded with the fluorine ions dissociated from the chemical etching gas, thereby producing hydrofluoric acid (HF). In addition, the hydrofluoric acid is completely vaporized because the semiconductor substrate has a temperature of about 600° C. The vaporized hydrofluoric acid gas is exhausted from the process chamber 1. Thus, the amount of fluorine ions and hydrogen ions penetrating the semiconductor substrate are reduced as compared to the conventional high-density plasma CVD process. Also, the reduction of the fluorine ions inside the process chamber 1 may prevent the process chamber 1 from being corroded by the fluorine ions. Further, since all of the first main process gases do not contain nitrogen; a pure silicon oxide layer can be formed. Furthermore, when forming contact holes by etching the silicon oxide layer, the contact holes are formed having normal profiles because the silicon oxide layer is void of substantially all or all defects.

According to another exemplary embodiment, preliminary process gases are injected into the process chamber 1 prior to injection of the first main process gases (step 17A of FIG. 2). The preliminary process gases include a silicon source gas, an oxygen gas and a helium gas. During the injection of the preliminary process gases, the silicon source gas reacts with the oxygen gas to form the initial silicon oxide layer 37, as shown in FIG. 3. Further, helium ions dissociated from the helium gas physically etch the overhangs 37A, as shown in FIG. 3. Furthermore, since the preliminary process gases are void of hydrogen, the injection of the preliminary process gases (step 17A) is preferably employed when the gap region G exposes the semiconductor substrate 30 to prevent the hydrogen ions from penetrating the semiconductor substrate 30. In other words, the absence of hydrogen ions during the formation of various semiconductor devices, e.g., MOS transistors, prevents defects, e.g., unstable electrical characteristics in a threshold voltage of a semiconductor device, from forming in a semiconductor device.

According to yet another exemplary embodiment, after the injection of the first main process gases (step 19A), second main process gases may be injected into the process chamber 1 (step 21A). The second main process gases include a helium gas as well as the first main process gases. Therefore, a physical etching process can be simultaneously performed with the chemical etching process during the injection of the second main process gases.

According to still another exemplary embodiment, after the injection of the second main process gases, third main process gases may be injected into the process chamber 1 (step 23A). The third main process gases include a silicon source gas, an oxygen gas and a hydrogen gas. In other words, when the third main process gases are injected, only a deposition process is performed. Thus, a deposition rate can be significantly increased. In addition, the third main process gases are preferably injected after reducing the aspect ratio of the gap region G using the first main process gases or the first and second main process gases. Further, during the injection of the third main process gases, hydrogen ions can be continuously produced while fluorine ions are no longer generated. In other words, while the third main process gases are injected, the fluorine ions remaining in the process chamber 1 can be completely purged. Further, the hydrogen ions may penetrate the surface of an underlying layer, e.g., a silicon oxide layer, into a bulk region having a depth of about 50 Å under the presence of the high density plasma, thereby removing the fluorine atoms contain in the underlying layer.

Furthermore, after injecting the third main process gases, the preliminary process gases may again be injected into the process chamber 1 (step 17B).

According to another exemplary embodiment, at least one of the steps of injecting the preliminary process gases (step 17A and 17B), the second main process gases (step 21A) and the third main process gases (step 23A) described above in reference to the above exemplary embodiment is omitted.

According to still yet another exemplary embodiment of the present invention, the injection of the process gases 25 can be performed by injecting the second main process gases only (step 19B). In addition, the preliminary process gases may be injected prior to the injection of the second main process gases like the first embodiment (step 17A).

Moreover, after injection of the second main process gases, the first main process gases, the third main process gases, and the preliminary process gases may be sequentially injected into the process chamber 1 (steps 21B, 23B, and 17B).

Furthermore, in the exemplary embodiment described above, at least one of the steps of injecting the preliminary process gases (step 17A and 17B), the step of injecting the first main process gases (step 21B) and the step of injecting the third main process gases (step 23B) may be omitted.

Figure 4:
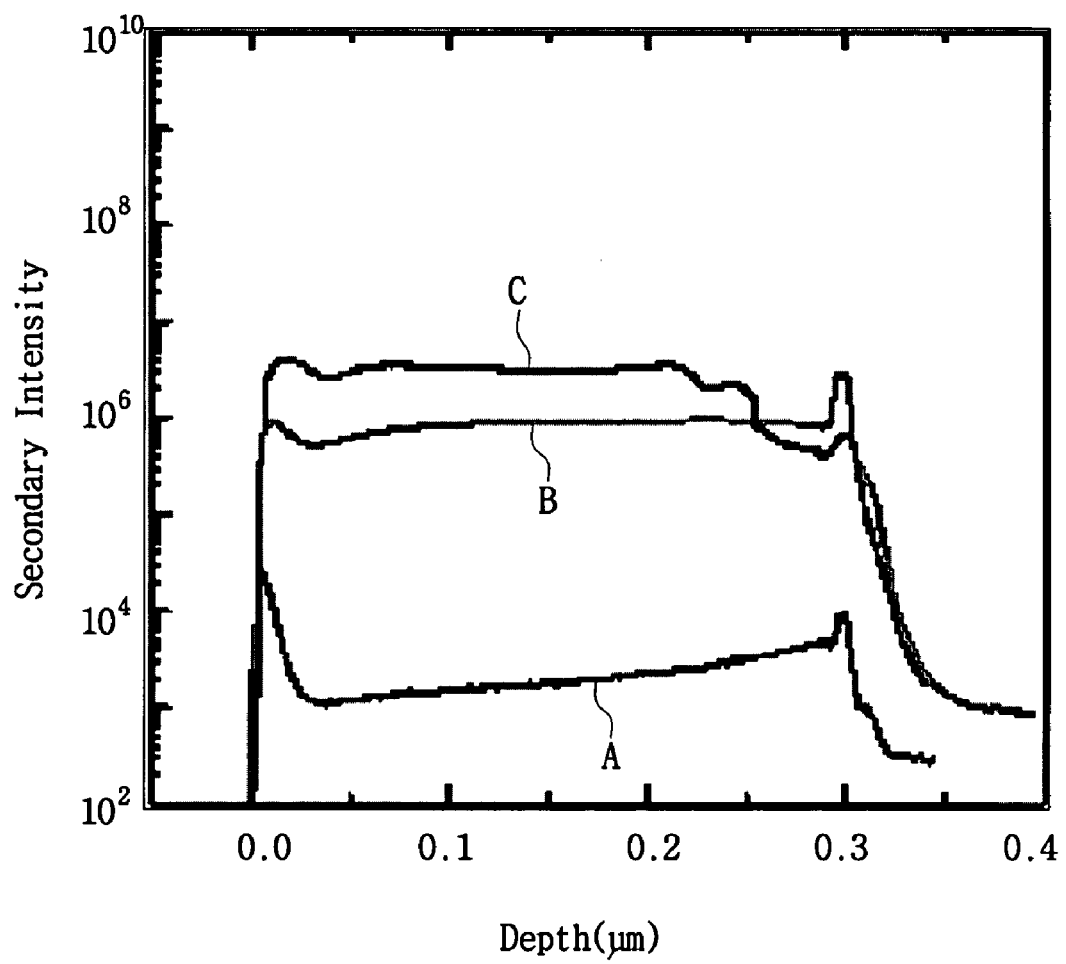
FIG. 4 is a graphical representation of the secondary ion mass spectroscopy (SIMS) profiles illustrating fluorine concentrations in silicon oxide layers formed using a conventional high-density plasma CVD process.

FIG. 4 is a graphical representation of measurement results of fluorine concentrations in silicon oxide layers formed by using a conventional high-density plasma CVD process. The fluorine concentrations were measured using a secondary ion mass spectroscopy (SIMS). In FIG. 4, the abscissa represents the depth from the surface of the silicon oxide layer, and the ordinate represents the secondary ion intensity. The secondary ion intensity is proportional to the concentration of the fluorine ions remaining in the silicon oxide layer.

The conventional silicon oxide layers exhibiting the measurement results of FIG. 4 were formed on a bare silicon substrate using key process conditions described in the following Table 1.

TABLE 1

| process parameters | sample A | sample B | sample C |
|---|---|---|---|
| $SiH_4$ gas | | 80 sccm (standard cubic centimeter per minute) | |
| $O_2$ gas | | 160 sccm | |
| He gas | | 450 sccm | |
| $NF_3$ gas | 0 sccm | 70 sccm | 95 sccm |
| plasma power | | 6000 watt | |
| bias power | | 2100 watt | |
| substrate temperature | | 600° C. | |

In Table 1 and FIG. 4, sample A was formed without injecting a $NF_3$ gas into a process chamber. Samples B and C were formed including the injecting of a $NF_3$ gas into a process chamber at 70 sccm and 95 sccm, respectively, while all other process criteria was the same as sample A. In addition, sample A was used to confirm that the use of a $NF_3$ gas influences the fluorine concentration in silicon oxide layers.

As shown in Table 1 and FIG. 4, a conventional high density plasma CVD process was performed without $NF_3$ gas as a chemical etching gas to form sample A, and the fluorine concentration, in sample A, corresponding to a second ion intensity was about $1\times10^4$. Samples B and C were formed using a conventional high density plasma CVD process with $NF_3$ gas as a chemical etching gas, and the conventional silicon oxide layers, samples B and C, exhibited fluorine concentrations corresponding to a secondary ion intensity of about $1\times10^6$.

Figure 5:
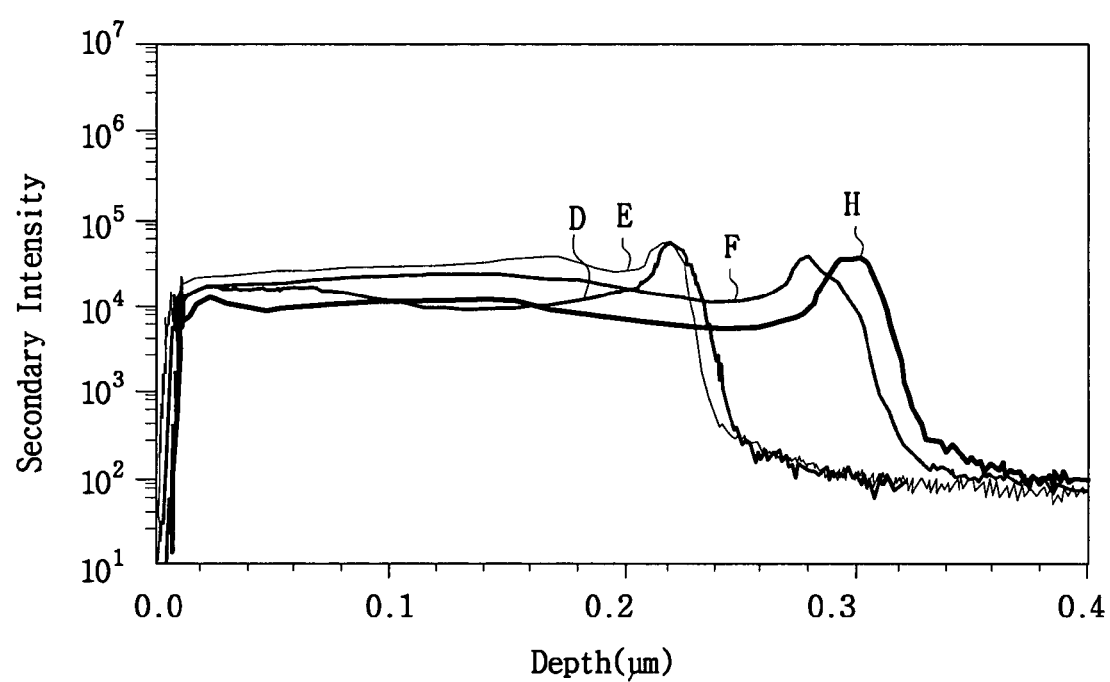
FIG. 5 is graphical representation of the secondary ion mass spectroscopy (SIMS) profiles illustrating the fluorine concentrations in silicon oxide layers formed according to exemplary embodiments of the present invention.

FIG. 5 is a graphical representation of measurement results of the fluorine concentrations in silicon oxide layers formed according to various exemplary embodiments of the present invention. The fluorine concentrations were also measured using a SIMS. In FIG. 5, the abscissa represents the depth from the surface of the silicon oxide layer, and the ordinate represents the secondary ion intensity.

The silicon oxide layers exhibiting the measurement results of FIG. 5 were formed on a bare silicon substrate using key process conditions described in the following Table 2.

TABLE 2

| Process parameters | | sample D | sample E | sample F | sample H |
|---|---|---|---|---|---|
| a first process | $SiH_4$ gas | | | 42 sccm | |
| | $O_2$ gas | | | 75 sccm | |
| | He gas | | | 100 sccm | |
| | process pressure | | | 1.5 mTorr | |
| | substrate temperature | | | 625° C. | |
| a second process | $SiH_4$ gas | 40 sccm | | 44 sccm | |
| | $SiF_4$ gas | 20 sccm | | 23 sccm | |
| | $O_2$ gas | 75 sccm | | 72 sccm | |
| | $H_2$ gas | 70 sccm | | 60 sccm | |
| | process pressure | | | 2.7 mTorr | |
| | substrate temperature | | | 694° C. | |
| | plasma power | | | 5000 watt | |
| | bias power | | | 1500 watt | |

In FIG. 5, the data represented by reference characters "D" and "F" are measurement results at a central portion of a silicon substrate, and the data represented by reference characters "E" and "H" are measurement results at an edge portion of the silicon substrate.

As shown in Table 2 and FIG. 5, a high-density plasma CVD process according to exemplary embodiments of the present invention were performed using $SiF_4$ gas as a chemical etching gas. Yet, the silicon oxide layers formed according to the exemplary embodiments of the present invention exhibited low fluorine concentrations corresponding to secondary intensity of about $1\times10^4$. It can be understood that hydrogen gas is used as a reactant gas to react with the fluorine atoms and produce hydrofluoric acid. The hydrofluoric acid is then vaporized because the temperature of the silicon substrate is greater than about 600° C. and the vaporized hydrofluoric acid gas is exhausted through an outlet of the process chamber.

Figure 6:
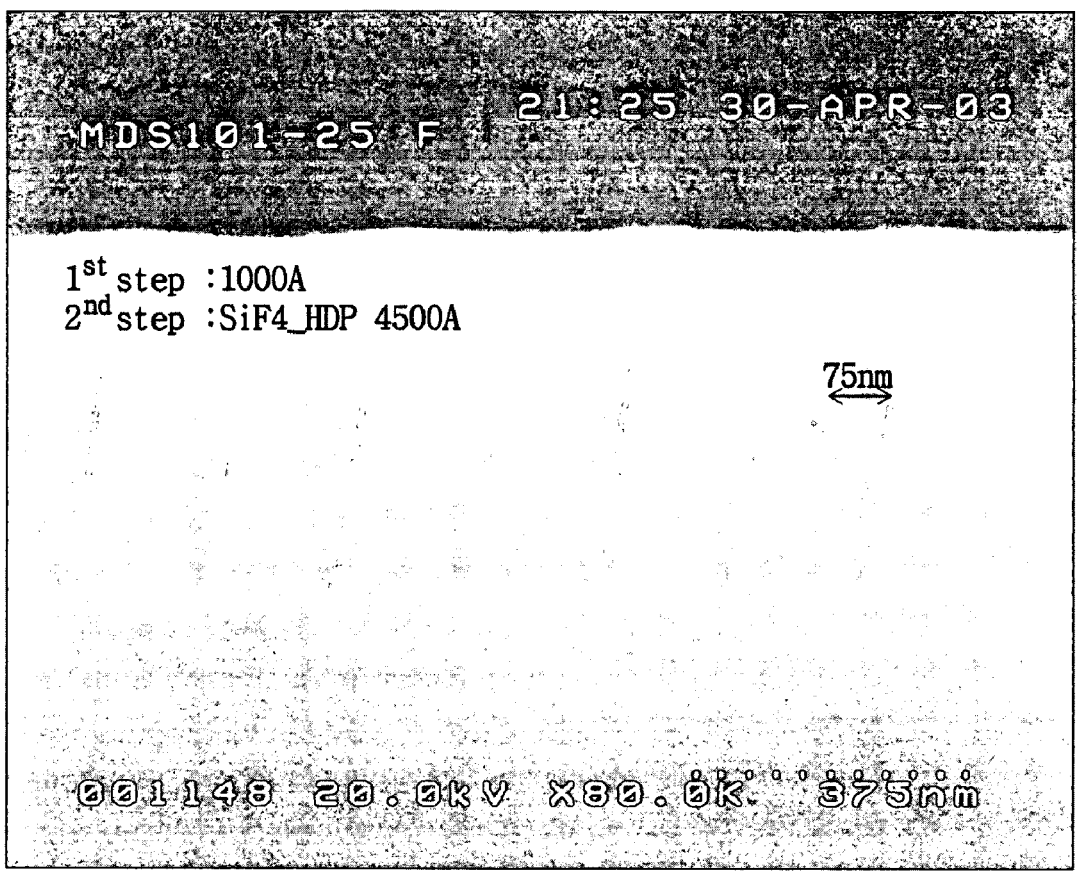
FIG. 6 is a photograph of a scanning electron microscopy (SEM) illustrating a sectional view of a silicon oxide layer formed on a semiconductor substrate having trench regions in accordance with embodiments of the present invention.

FIG. 6 is a photograph of a scanning electron microscopy (SEM) illustrating a cross-sectional view of a silicon oxide layer formed using the process conditions shown in Table 2. The silicon oxide layer was formed on the semiconductor substrate where trench regions having a width of about 75 nm were formed.

As shown in FIG. 6, the silicon oxide layer formed according to the present invention completely filled the trench regions having a width of about 75 nm without any voids.

As described above, according to the embodiments of the present invention, the process gases do not contain nitrogen. Thus, a pure and uniform material layer can be formed, and a normal profile can be achieved when patterning the material layer. Further, the fluorine ions acting as a chemical etchant can be completely vaporized using a hydrogen gas and a temperature of about 550° or greater. Thus, the amount of the fluorine atoms and the hydrogen atoms in the material layer are significantly reduced, thereby preventing defects from forming in a semiconductor device. In addition, the hydrogen reduces the amount of the fluorine remaining in the process chamber. Therefore, the corrosion of the process chamber due to the fluorine is also prevented.

While the present invention has been particularly shown and described with reference to exemplary embodiments thereof, it will be understood by those skilled in the art that the foregoing and other changes in form and details may be made therein without departing from the spirit and scope of the present invention.

What is claimed is:

1. A high-density plasma CVD process comprising the steps of:
    a) preparing a semiconductor substrate;
    b) loading the semiconductor substrate into a process chamber;
    c) injecting first main process gases including a silicon source gas, an oxygen gas, a nitrogen free chemical etching gas and a hydrogen gas into the process chamber to generate a high density plasma over the semiconductor substrate and to simultaneously form a silicon oxide layer on the semiconductor substrate;
    d) injecting second main process gases into the process chamber after the injection of the first main process gases, wherein the second main process gases include a silicon source gas, an oxygen gas, a nitrogen free chemical etching gas, a hydrogen gas and a helium gas; and
    e) injecting third main process gases into the process chamber after the injection of the second main process gases, wherein the third main process gases include a silicon source gas, an oxygen gas and a hydrogen gas, wherein the semiconductor substrate is heated to a temperature in a range of about 550° C. to about 700° C.

2. The high-density plasma CVD process according to claim 1, wherein the high density plasma is generated by applying a plasma power to an induction coil installed outside the process chamber and a bias power to the semiconductor substrate during the injection of the first main process gases.

3. The high-density plasma CVD process according to claim 2, wherein the plasma power is in the range of about 2500 to about 5000 watts and the bias power is in the range of about 800 to about 4000 watts.

4. The high-density plasma CVD process according to claim 1, wherein the silicon source gas is a silane ($SiH_4$) gas or a disilane ($Si_2H_6$) gas, and the nitrogen free chemical etching gas is a silicon fluoride ($SiF_4$) gas.

5. The high-density plasma CVD process according to claim 1, further comprising the step of injecting preliminary process gases into the process chamber prior to the injection of the first main process gases to generate a high density plasma over the semiconductor substrate and to simultaneously form an initial silicon oxide layer on the semiconductor substrate, wherein the preliminary process gases include a silicon source gas, an oxygen gas and a helium gas.

6. The high-density plasma CVD process according to claim 1, further comprising the step of injecting preliminary process gases into the process chamber after the injection of the third main process gases, wherein the preliminary process gases include a silicon source gas, an oxygen gas and a helium gas.

7. A high density plasma CVD process comprising the steps of:
 a) preparing a semiconductor substrate;
 b) loading the semiconductor substrate into a process chamber; and
 c) injecting first main process gases including a silicon source gas, an oxygen gas, a nitrogen free chemical etching gas, a helium gas and a hydrogen gas into the process chamber to generate a high density plasma above the semiconductor substrate and to simultaneously form a silicon oxide layer on the semiconductor substrate;
 d) injecting second main process gases into the process chamber after the injection of the first main process gases, wherein the second main process gases include a silicon source gas, an oxygen gas, a nitrogen free chemical etching gas and a hydrogen gas; and
 e) injecting third main process gases into the process chamber after the injection of the second main process gases, wherein the third main process gases include a silicon source gas, an oxygen gas and a hydrogen gas, wherein the semiconductor substrate is heated to a temperature in the range of about 550° C. to about 700° C.

8. The high-density plasma CVD process according to claim 7, wherein the high density plasma is generated by applying a plasma power to an induction coil installed outside the process chamber and a bias power to the semiconductor substrate during the injection of the first main process gases.

9. The high-density plasma CVD process according to claim 8, wherein the plasma power is in a range of about 2500 to about 5000 watts and the bias power is in a range of about 800 to about 4000 watts.

10. The high-density plasma CVD process according to claim 7, wherein the silicon source gas is a silane ($SiH_4$) gas or a disilane ($Si_2H_6$) gas, and the nitrogen free chemical etching gas is a silicon fluoride ($SiF_4$) gas.

11. The high-density plasma CVD process according to claim 7, further comprising the step of injecting preliminary process gases into the process chamber prior to the injection of the first main process gases to generate a high density plasma over the semiconductor substrate and to simultaneously form an initial silicon oxide layer on the semiconductor substrate, wherein the preliminary process gases include a silicon source gas, an oxygen gas and a helium gas.

12. The high-density plasma CVD process according to claim 7, further comprising the step of injecting preliminary process gases into the process chamber after the injection of the third main process gases, wherein the preliminary process gases include a silicon source gas, an oxygen gas and a helium gas.

* * * * *